United States Patent [19]

Kuo et al.

[11] Patent Number: 5,742,246

[45] Date of Patent: Apr. 21, 1998

[54] STABILIZING MECHANISM FOR SIGMA-DELTA MODULATOR

[75] Inventors: Tai-Haur Kuo; Wen-Chyi Wang; Kuan-Dar Chen; Jhy-Rong Chen; Jhy-Woei Yeh, all of Tainan, Taiwan

[73] Assignee: National Science Council, Taipei, Taiwan

[21] Appl. No.: 622,449

[22] Filed: Mar. 22, 1996

[51] Int. Cl.$^6$ .................................................. H03M 3/02
[52] U.S. Cl. ............................ 341/143; 341/172; 341/155
[58] Field of Search ........................... 341/143, 172, 341/155

[56] References Cited

U.S. PATENT DOCUMENTS

| | | | |
|---|---|---|---|
| 5,012,244 | 4/1991 | Wellard et al. | 341/143 |
| 5,079,550 | 1/1992 | Sooch et al. | 341/143 |
| 5,148,167 | 9/1992 | Ribner | 341/143 |
| 5,150,120 | 9/1992 | Yunus | 341/143 |
| 5,202,685 | 4/1993 | Nagata | 341/76 |
| 5,243,345 | 9/1993 | Naus et al. | 341/143 |
| 5,245,343 | 9/1993 | Greenwood et al. | 341/143 |
| 5,248,972 | 9/1993 | Karema et al. | 341/143 |
| 5,325,399 | 6/1994 | Haspeslagh et al. | 375/28 |
| 5,379,039 | 1/1995 | Charaska et al. | 341/143 |

OTHER PUBLICATIONS

Chris Dunn and Mark Sandler, "Use of Clipping in Sigma-Delta Modulators," IEE, Savoy Place, London WC2R OBL, UK, pp. 8/1–8/9 (1994).

S. Mohsen Moussavi et al., "High-Order Single-Bit Oversampling A/D Converter Stabilized with Local Feedback Loops," IEEE Trans. on Circuits and Systems—II: Analog and Digital Signal Processing, vol. 41, No. 1, Jan. 1994, pp. 19–25.

Primary Examiner—Brian K. Young
Assistant Examiner—Jason L.W. Kost
Attorney, Agent, or Firm—Hitt Chwang & Gaines

[57] ABSTRACT

The invention relates to a technique called "Internal Linear Feedback (ILF)" for the stabilization of high-order sigma-delta modulators. The ILF technique involves an overload detector and a selector. Once "overloaded" is detected by the overload detector, the selector is activated to make the modulator entering the ILF mode, in which additional internal linear feedback paths are employed to stabilize the modulator. Otherwise, the modulator operates in normal mode as a general high-order modulator.

18 Claims, 8 Drawing Sheets

STABILIZING MECHANISM FOR SIGMA-DELTA MODULATOR

FIELD OF THE INVENTION

The invention relates to a technique of stabilizing high-order sigma-delta modulators.

BACKGROUND OF THE INVENTION

In recent years, sigma-delta modulation is a very popular technique to obtain high resolution for analog-to-digital converters (ADCs) and digital-to-analog converters (DACs). Unlike the conventional Nyquist-rate converters, the sigma-delta modulators use oversampling as well as noise shaping techniques at the same time. The oversampling technique can relax the specification of the anti-aliasing filter, that is, allowing the use of a less stringent analog low-pass filter. The noise-shaping technique can move most of the quantization noise in the baseband to higher frequency and subsequently removed by the followed digital filter, such that high resolution can be obtained. Besides, in contrast to the Nyquist-rate converters which need good analog components matching or complex correction circuits to obtain high resolution (>10 bits), the sigma-delta modulators can provide higher resolution with only modest precision analog components, thus the realization cost could be lower and the production yield could consequently be improved.

Due to the requirement of high resolution and low oversampling ratio in high speed application, it is a trend to develop high-order (order>2) modulators. However the inherent instability problem associated with high-order sigma-delta modulators is even now difficult to solve. For many high-order modulators, they could become overloaded if their inputs are large enough or with some specific waveform. Once "overloaded" occurs, they may be locked at oscillation state or resumed to normal operation very slowly even after input signals are well-controlled. These modulators are not absolutely stable. In order to solve this problem, efforts have been tried to prevent the instability problem. Among these, reset and clipping maybe the most straightforward mechanisms. However, for the former, large harmonic distortion results because information stored in the integrators is lost and discontinuous signals are generated; for the latter, performance would still be substantially degraded, besides, for some modulators with very small clipping level, it is still unstable.

Therefore, an effective technique for stabilizing high-order Sigma-Delta modulators by overload recovery means is still an urgent need in the art.

SUMMARY OF THE INVENTION

To address the above-described deficiencies of the prior art, the present invention provides an internal linear feedback ("ILF") mechanism for stabilizing high-order sigma-delta modulators. In one embodiment, the high-order sigma-delta modulator is a multiple-feedback type which includes at least three cascaded integrator stages an analog-to-digital converter ("ADC") means to which the output of the last integrator stage is connected, and a digital-to-analog converter (DAC) means to which the output of the ADC means is connected, wherein the output of the DAC means is connected to the input of each integrator stage in a negative feedback sense, and at least the first integrator stage in the high-order sigma-delta modulator forms a low-order modulator which is stable at all input signal levels and staff-up conditions. In other embodiments, the high-order sigma-delta modulator is a feedforward type. In related embodiments, the ILF mechanism is suitably employed with sigma-delta modulators in both ADCs and DACs.

In another embodiment, the ILF includes a coupling means for decoupling the input of the integrator stages following the low-order modulator from the output of the DAC means, and simultaneously coupling the input of the ADC means to the input of the integrator stages following the low-order modulator in a negative feedback sense when the output signal of any one of the integrator stages in the high-order sigma-delta modulator exceeds a predetermined range corresponding to the upper and lower limits of a stable operation range of the high-order sigma-delta modulator; the coupling means recoupling the output of the DAC means to the input of the integrator stages following the low-order modulator in a negative feedback sense and simultaneously decoupling the input of the integrator stages following the low-order modulator from the input of the ADC means when the output signal returns to the predetermined range.

In another embodiment, an ILF mechanism is used to stabilize feedforward ("FF") or "follow-the-leader" type high-order sigma-delta modulators which include at least three cascaded integrator stages, an ADC means to which the output of the last integrator stage is coupled and a DAC means to which the output of the ADC means is coupled, wherein at least the first integrator stage in the high-order sigma-delta modulator forms a low-order modulator which is stable at all input signal levels and staff-up conditions; the ILF mechanism including a coupling means for coupling the input of the ADC means to the input of the integrator stages following the low-order modulator, in a negative feedback sense, when the output signal of any one of the integrator stages in the high-order sigma-delta modulator exceeds a predetermined range corresponding to the upper and lower limits of a stable operation range of the high-order sigma-delta modulator. The ILF mechanism decouples the input of the integrator stages following the low-order modulator from the input of the ADC means when the output signal returns to the predetermined range.

In another embodiment, an ILF mechanism is used to stabilize a multiple-feedback type high-order sigma-delta modulator utilized in DACs, the high-order sigma-delta modulator including at least three cascaded integrator stages and a digital quantizer means to which the output of the last integrator stage is connected, wherein an output of the digital quantizer means is connected to the input of each integrator stage, in a negative feedback sense, and at least the first integrator stage in the high-order sigma-delta modulator forms a low-order modulator which is stable at all input signal levels and start-up conditions, the ILF mechanism including a coupling means for decoupling the inputs of the integrator stages following the low-order modulator from the output of the digital quantizer means and simultaneously coupling the input of the digital quantizer means to the inputs of the integrator stages following the low-order modulator, in a negative feedback sense, when the output signal of any one of the integrator stages in the high-order sigma-delta modulator exceeds a predetermined range corresponding to upper and lower limits of a stable operation range of the high-order sigma-delta modulator; the ILF mechanism recoupling the output of the digital quantizer means to the input of the integrator stages following the low-order modulator, in a negative feedback sense, and simultaneously decoupling the inputs of the integrator stages following the low-order modulator from the input of the digital quantizer means when the output signal returns to said predetermined range.

In still a further embodiment, the ILF mechanism disclosed by the present invention may be employed to stabilize a feedforward or follow-the-leader type high-order sigma-delta modulators utilized in DACs, the high-order sigma-delta modulators including at least three cascaded integrator stages and a digital quantizer means to which the output of the last integrator stage is connected, wherein at least the first integrator stage in the high-order sigma-delta modulator forms a low-order modulator which is stable at all input signal levels and start-up conditions, the ILF mechanism including a coupling means for coupling an input of the digital quantizer means to the input of the integrator stages following the low-order modulator, in a negative feedback sense, when the output signal of any one of the integrator stages in the high-order sigma-delta modulator exceeds a predetermined range corresponding to upper and lower limits of a stable operation range of the high-order sigma-delta modulator; the ILF mechanism decoupling the inputs of the integrator stages following the low-order modulator from the input of the digital quantizer means when the output signal returns to said predetermined range.

For all ADC embodiments, the components used in the high-order sigma-delta modulators are suitably operative with analog signals. For all DAC embodiments, the components used in the high-order sigma-delta modulators are suitably operative with digital signals.

The ILF mechanisms disclosed by the present invention can be applied to both lowpass and bandpass structures, and the loop filter of the high-order sigma-delta modulators can be realized using either discrete-time or continuous-time circuits.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiments disclosed herein as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention and the advantages, thereof, reference is now made to the following description taken in conjunction with the accompanying Drawings in which.

DETAILED DESCRIPTION OF THE PREFERRED EMBODIMENTS

In this invention we disclose a simple and effective technique called "Internal Linear Feedback (ILF)"to stabilize high-order sigma-delta modulators. In comparison with the previous arts, it offers significant performance improvement. This novel technique can be applied to various modulator configurations such as multiple-feedback (MF), feedforward (FF) and follow-the-leader (FL) configurations.

This ILF technique comprises an overload detector and a selector. When the overload detector detects the output signal of any one of the integrators in the modulator exceeding a predetermined range, a signal is sent to initiate the selector which makes the modulator entering the ILF mode. On the other hand, if the output signals of all the integrators in the modulators do not exceed the predetermined range, the modulator remains operating in the normal mode, in which it acts as a general high-proceeding order modulator. In the ILF mode, for the FF and FL configurations, additional internal linear feedback paths from the input of the analog-to-digital converter (ADC) to the inputs of high order (>2) integrators are employed to stabilize the modulator. For the MF configuration operating in the ILF mode, the selector switches the feedback paths connecting to the inputs of high order (>2) integrators from digital-to-analog converter (DAC) output to the ADC input where the DAC input is connected to the ADC output. This mechanism provides the stabilization means.

Figure 1:
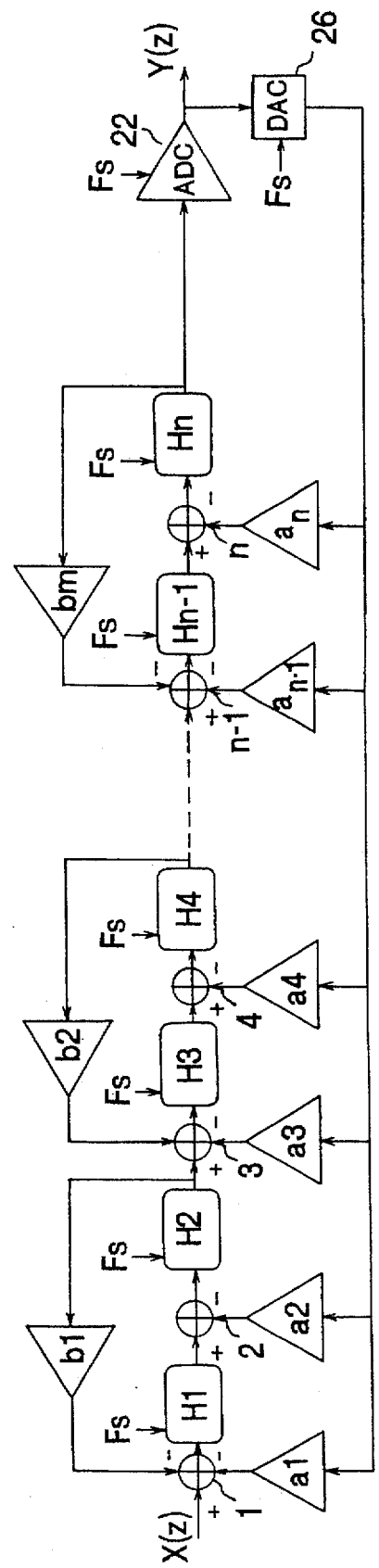
FIG. 1 shows a block diagram of prior art sigma-delta modulator realized in a multiple feedback (MF) configuration.
Figure 3:
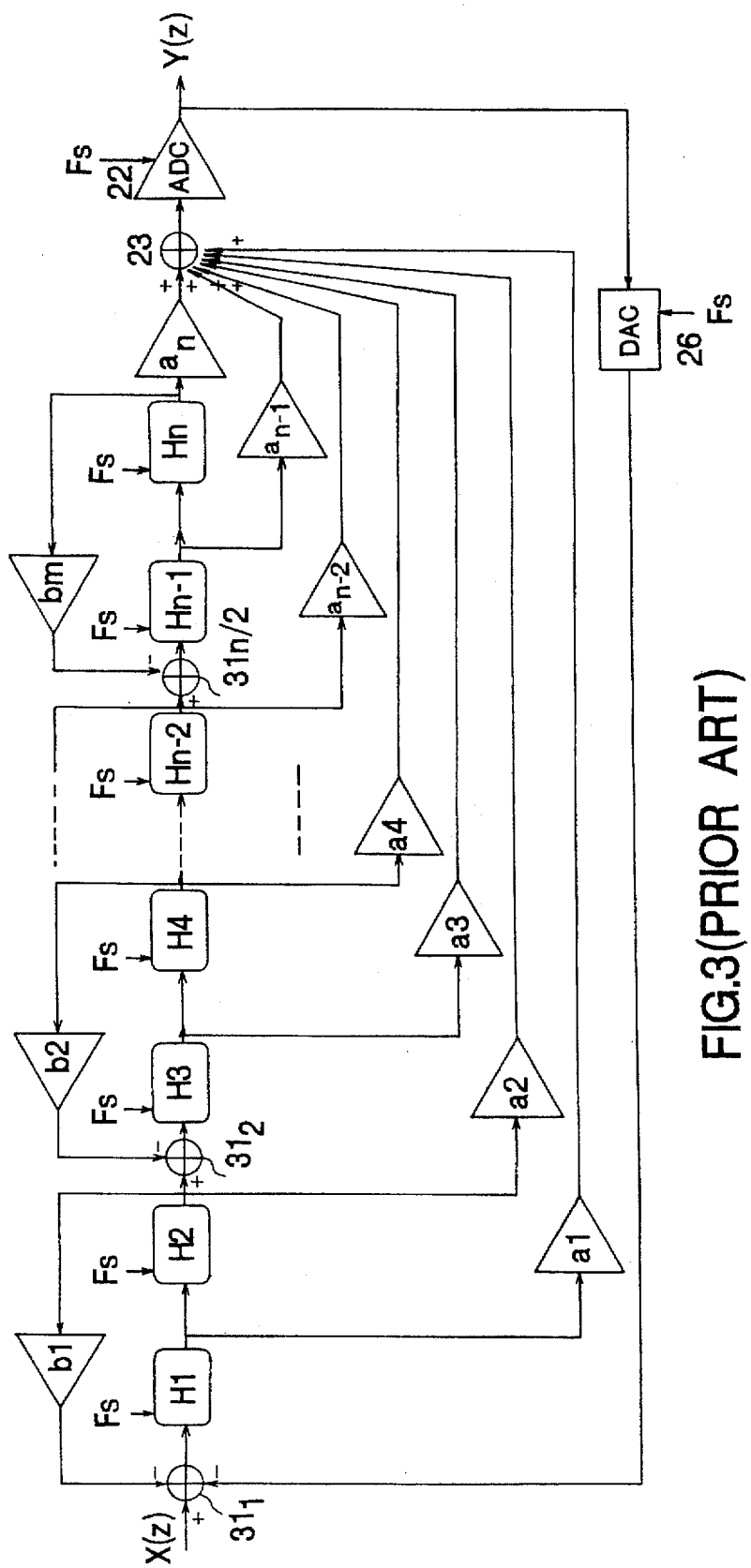
FIG. 3 shows a block diagram of prior art sigma-delta modulator realized in a feedforward (FF) configuration.

Sigma-delta modulators utilized in sigma-delta analog-to-digital converters ($SDADC_s$) can be realized by many configurations like multiple-feedback (MF) as shown in FIG. 1, or feedforward (FF) as shown in FIG. 3. The sigma-delta modulators in FIG. 1 and FIG. 3 comprise a series connection of n integrator stages $H_1, H_2, \ldots H_n$. The order of the modulator is just equal to the number of the integrator stages. A modulator is said to be high-order if it comprises at least three integrator stages. In the following, we will describe these two configurations in detail, and later take them as illustrations for the preferred embodiments of our invention.

In the MF-type modulator shown in FIG. 1, a digital output signal $Y(z)$ of an analog-to-digital converter (ADC) means 22 is passed through by a digital-to-analog converter (DAC) means 26 and then scaled by a feedback coefficient $a_1$ and subtracted from an input signal $X(z)$ of the modulator in a subtractor means 1 and then applied to the first integrator stage $H_1$. A similar subtractor means $2, 3, \ldots, n$ is provided in the input of each subsequent integrator stage $H_2$, $H_3, \ldots, H_n$ for subtracting the output signal $Y(Z)$ passed through the DAC means 26 and scaled by a respective feedback coefficient $a_2, a_3, \ldots, a_n$ from the output signal of a proceeding integrator stage and applying the difference to the input of a subsequent integrator stage. The subtractor means 1 also subtracts the output signal of the integrator stage $H_2$ scaled by a feedback coefficient $b_1$ from the input signal $X(z)$. Correspondingly, the subtractor means n−1 also subtracts the output signal of the integrator stage $H_n$ scaled by a feedback coefficient $b_m$ from the output signal of the proceeding integrator stage $H_{n-2}$. The ADC means 22, the DAC means 26, the subtractor means $1, \ldots, n$ and the signal transferred in the integrator stages $H_1, \ldots, H_n$ are controlled by the oversampling clock $F_s$ if they are realized in the discrete-time form.

In the FF-type modulator shown in FIG. 3, a digital output signal $Y(z)$ of an analog-to-digital converter (ADC) means 22 passed through by a digital-to-analog converter (DAC) means 26 and an output signal of the second integrator stage $H_2$ scaled by a feedback coefficient $b_1$ are subtracted from an input signal $X(z)$ of the modulator in a subtractor means $31_1$. The output of the subtractor means $31_1$ is applied to the first integrator stage $H_1$ having an output connected to the input of the second integrator stage $H_2$. An output signal of the fourth integrator stage $H_4$ is scaled by a feedback coefficient $b_2$ and then subtracted from the output of the second integrator stage $H_2$ in a subtractor means $31_2$, then the difference is applied to the third integrator stage $H_3$. Similarly, an output signal of the integrator stage $H_n$ is scaled by a feedback coefficient $b_m$ and then subtracted from the output of the integrator stage $H_{n-2}$, and the difference is applied to the integrator stage $H_{n-1}$. The output of the integrator stage $H_{n-1}$ is connected to the input of the integrator stage $H_n$. In addition, the output of the integrator stage $H_1, \ldots, H_n$ are scaled by feedforward coefficients $a_1, \ldots, a_n$ and then applied to the summing means 23 having an output connected to the ADC means 22. The ADC means 22, the DAC means 26, the subtractor mean $31_1, \ldots, 31_{n/2}$, the summing means 23 and the signal transferred in the integrator stages $H_1, \ldots, H_n$ are controlled by the oversampling clock $F_s$ if they are realized in the discrete-time form. In both the MF and FF configurations, the quantization noise introduced by the ADC means 22 could be effectively suppressed in the baseband by proper determination of these coefficients $a_i$'s and $b_i$'s. Usually, there exists trade-offs between performance and stability, that is, the better noise shaping ability we obtain, the increased instability probability we meet.

The principle of the invented Internal Linear Feedback (ILF) technique is based on the root locus method while the linearized model is adopted. The nonlinear quantizer such as the ADC means 22 in the attached drawings can be modeled as a variable gain factor. As varying the quantizer gain, the root locus of the sigma-delta modulator can be investigated for examining whether the modulator is stable. According to this method, we stabilize the modulator by temporarily changing the root locus while instability occurs. We move the originally unstable root locus inside the stable region by adding some internal linear feedback paths. In MF configuration, in addition, some feedback paths causing instability are also removed.

Figure 2:
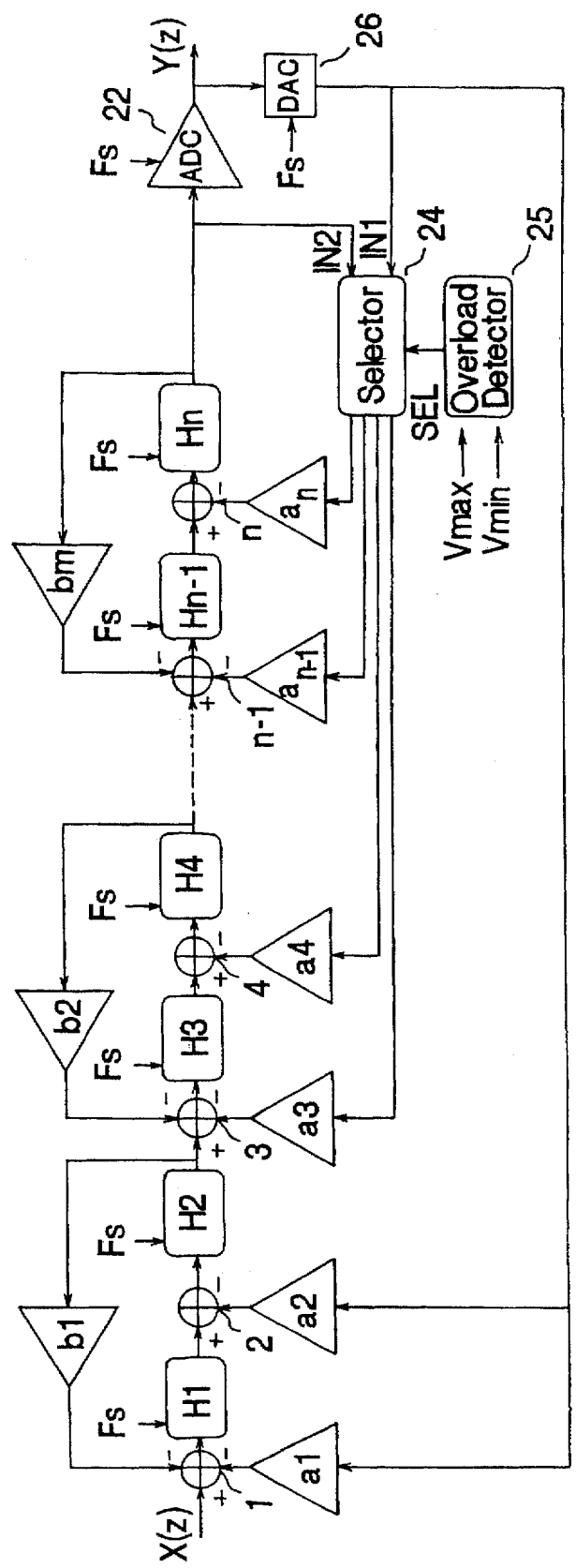
FIG. 2 shows a block diagram of a MF-type sigma-delta modulator, in which an ILF stabilizing mechanism according to the present invention is applied.
Figure 4:
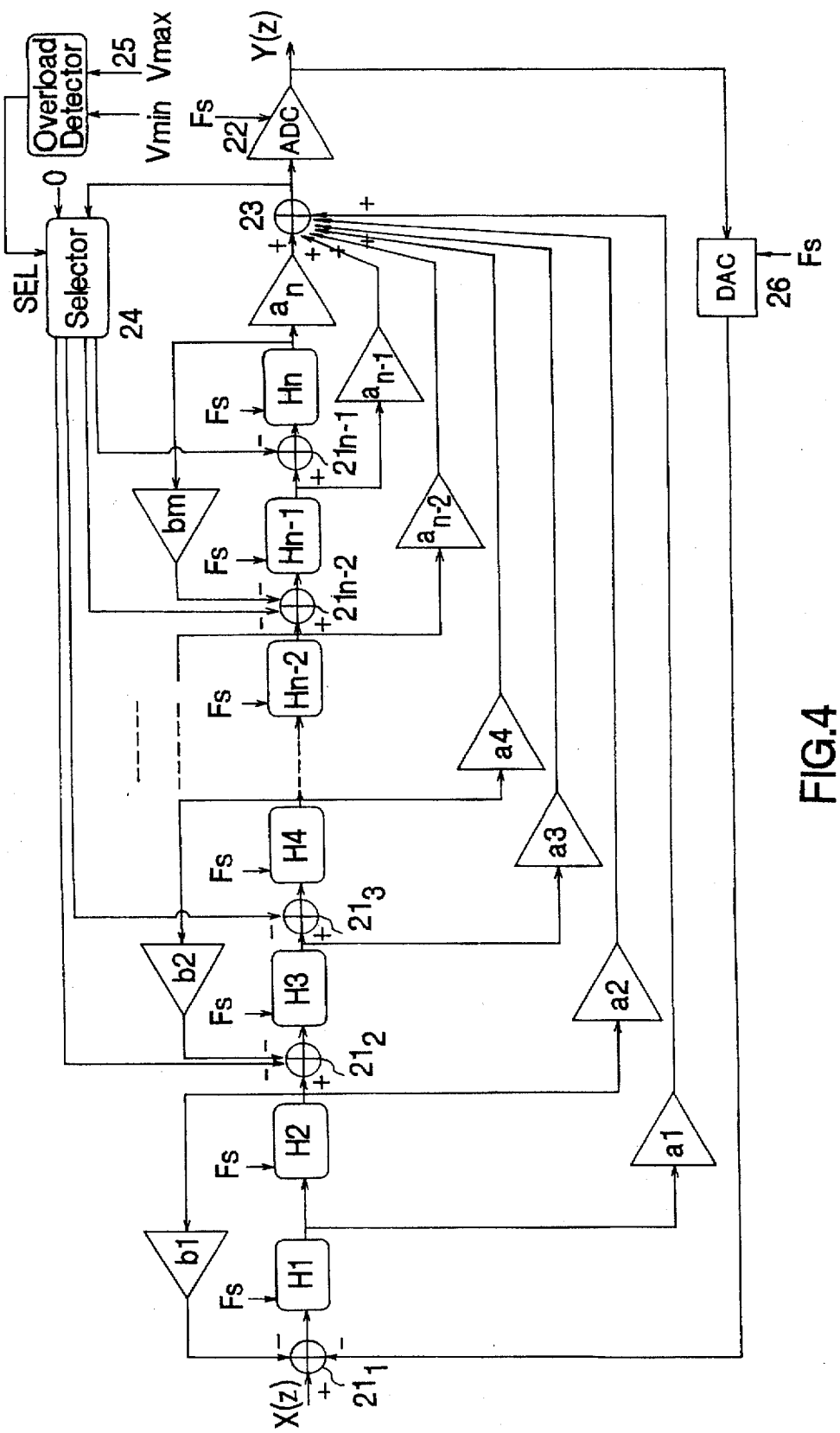
FIG. 4 shows a block diagram of a FF-type sigma-delta modulator, in which an ILF stabilizing mechanism according to the invention is applied.

In the following this basic idea of the invention will be described by means of two illustration embodiments. The block diagram of FIG. 2 and FIG. 4 illustrate the realization of the stabilizing mechanism according to our invention on the sigma-delta modulators of the MF-type and FF-type configurations shown in FIG. 1 and FIG. 3, respectively. The structure of the sigma-delta modulator itself is substantially similar to the original one, where only differences relevant to the invention will be described below. The same reference numerals and symbols in FIG. 1 and FIG. 2 indicate the same elements or functions, and this condition also holds between FIG. 3 and FIG. 4.

In the first preferred embodiment shown in FIG. 2, the first or the first two integrator stages $H_1$, $H_2$ form a second-order sigma-delta modulator, which is stable. The output of the DAC means 26 is connected to the first input IN1 of a selector 24. The output of the last integrator stage $H_n$ is connected to the second input IN2 of the selector 24. The output signal of the selector 24 is scaled by a feedback coefficient $a_3$ and subtracted from the output of the second integrator stage $H_2$, then the difference is applied to the third integrator stage $H_3$. A similar subtractor means $4, \ldots, n$ is provided in the input of an integrator stage $H_4, \ldots, H_n$ for subtracting an output signal of the selector 24 scaled by a respective feedback coefficient $a_4, \ldots, a_n$ from the output signal of a preceding integrator stage $H_3, \ldots, H_{n-1}$. The selector 24 couples one of its input (IN1 or IN2) to its output depending on the state of an input selection signal SEL. When an overload detector 25 detects that the output signal of any one of the integrator stages exceeds a predetermined stable range $[V_{max}, V_{min}]$, the modulator is "overloaded". Once "overloaded" occurs, the overload detector 25 initiates the signal SEL to the selector 24 and the modulator enters the ILF mode, in which the selector 24 receives the SEL signal and couples its input IN2 rather than IN1 to its output. In the ILF mode, according to our invention, the modulator could be absolutely stabilized. Once the "overload" disappears, the overload detector 25 re-initiates the SEL signal to the selector 24 which then couples its input IN1 rather than IN2 to its output, that is, the modulator recoveries itself into the normal operation.

Figure 5A:
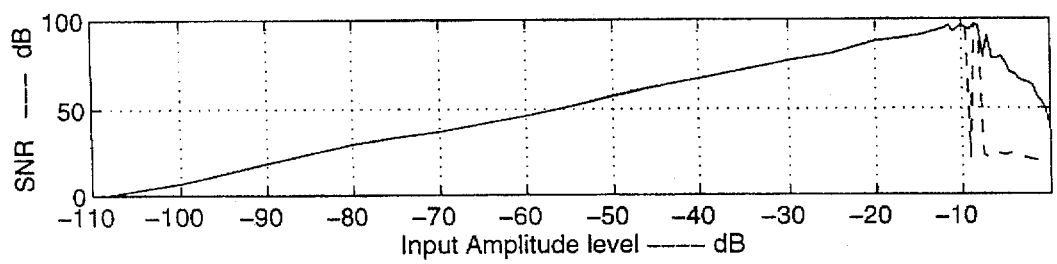
FIG. 5(a) is an input amplitude versus SNR (signal-noise ratio) plot which shows a dynamic range (DR) analysis of a MF-type sigma-delta modulator stabilized with the present ILF stabilizing mechanism (solid line) and without the present ILF stabilizing mechanism (dashed line)
Figure 5B:
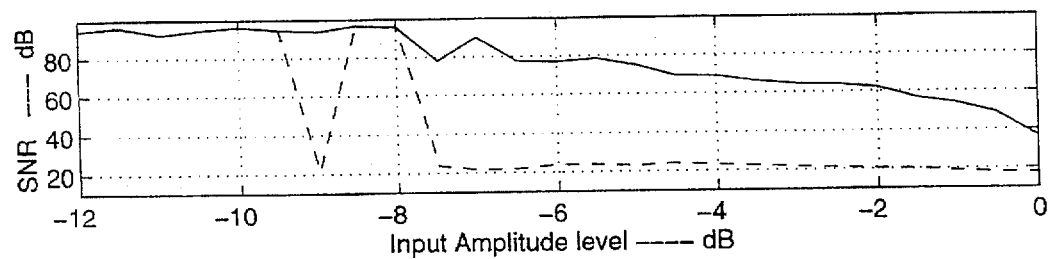
FIG. 5(B) is a microview of one part of the FIG. 5(a) plot.
Figure 5C:
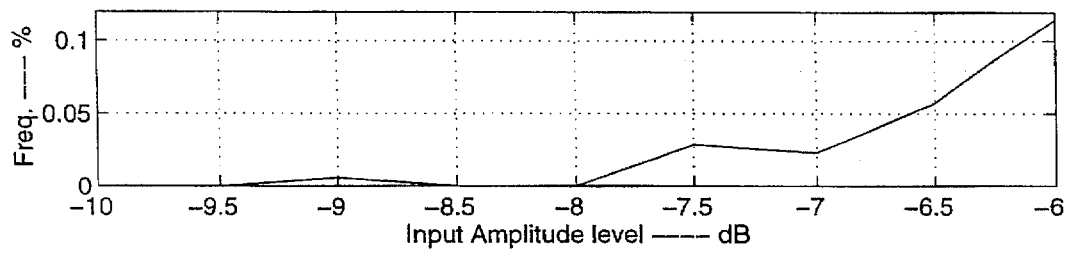
FIG. 5(C) is a plot which shows the ILF triggered frequency versus modulator input amplitude level.
Figure 6A:
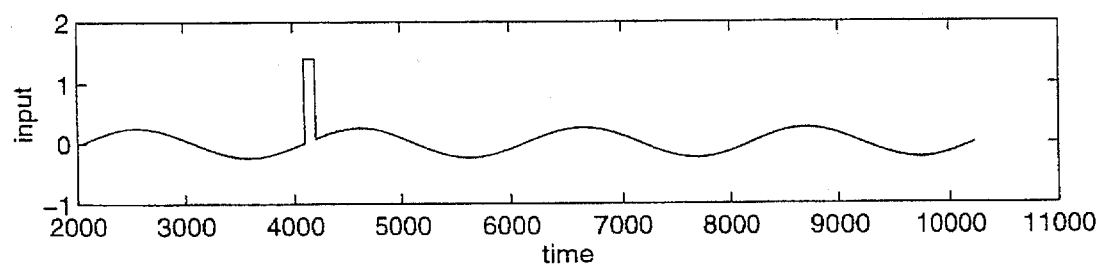
FIG. 6(a) is a plot which shows an input signal waveform to be used for a time-domain analysis.
Figure 6B:
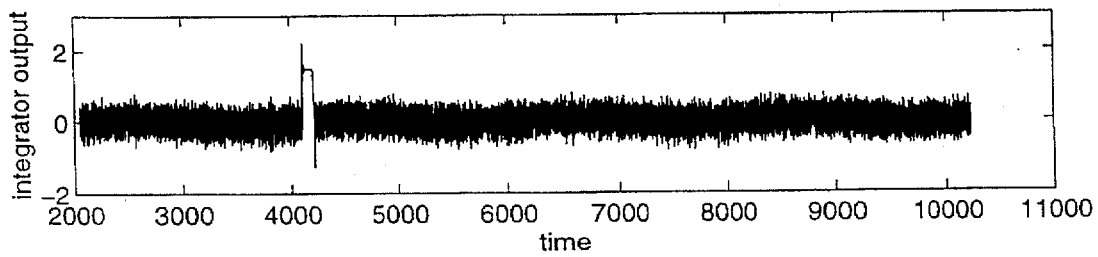
FIG. 6(b) is a time versus integrator output plot which shows a time-domain analysis of a MF-type sigma-delta modulator stabilized with the present ILF stabilizing mechanism.
Figure 6C:
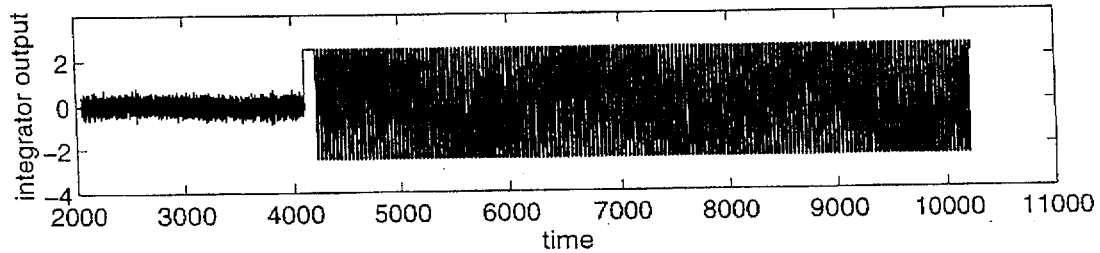
FIG. 6(c) is a time versus integrator output plot which shows a time-domain analysis of a MF-type sigma-delta modulator not stabilized with the present ILF stabilizing mechanism.

In the following, a fourth-order MF-type sigma-delta modulator in which the ILF stabilization according to the invention is applied is illustrated as an example for verifying our invention. The simulation condition is: oversampling ratio=64, baseband signal bandwidth=20 KHz, operating range of integrators=−2.5~2.5, $V_{max}$=1.4 and $V_{min}$=−1.4 while the DAC feedback reference is normalized to unity. For the frequency domain simulation as shown in FIGS. 5(a)–5(c), the invented ILF technique can effectively stabilize the modulator while the input level is large, consequently, the dynamic range (DR) is increased as shown. For the time-domain simulation as shown in FIGS. 6(a)–6(c), as a sinewave with an additive short-time pulse is applied to the input of the modulator a modulator with ILF technique will quickly be recovered to its normal mode operation while a modulator without ILF results in oscillation. This confirms that a modulator can be absolutely stabilized by adding the invented ILF technique.

In the second preferred embodiment of the invention, while overloaded is detected, the loop filter of the modulator is temporarily changed by adding the additional feedback paths, and this idea is suitable to the sigma-delta modulators of both the FF and FL-type configurations. In the following, only the FF-type modulator is illustrated as an example. In FIG. 4, the first or the first two integrator stages $H_1$, $H_2$ form a second-order sigma-delta modulator which is stable. The invented ILF technique comprises an overload detector 25 which is used to monitor the output signal of all the integrator stages $H_1, \ldots, H_n$, and a selector 24 which functions as controlling the connection between the output of the summing means 23 and the subtractor means $21_{20}, \ldots 21_{n-1}$. When the output signal of any one of the integrator stages exceeds a predetermined stable range [$V_{max}$, $V_{min}$], the modulator is "overloaded" Once "overloaded" occurs, the modulator enters in the ILF mode in which the overload detector 25 initiates a signal SEL to the selector 26 which subsequently enables the connection between the subtractors means and the summing means. In the ILF mode, according to our invention, the modulator can be guaranteed to be absolutely stable. The modulator recoveries to the normal mode while the "overload" disappears, wherein the overload detector 25 re-initiates the signal SEL to the selector 26. In the normal mode the selector 26 disables the connection between the subtractors means and the summing means.

Figure 7A:
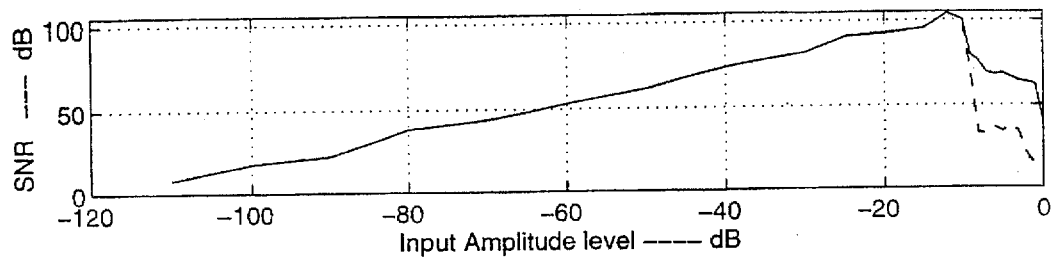
FIG. 7(a) is an input amplitude versus SNR (signal-noise ratio) plot which shows a dynamic range (DR) analysis of a FF-type sigma-delta modulator stabilized with the present ILF stabilizing mechanism (solid line) and without the present ILF stabilizing mechanism (dashed line)
Figure 7B:
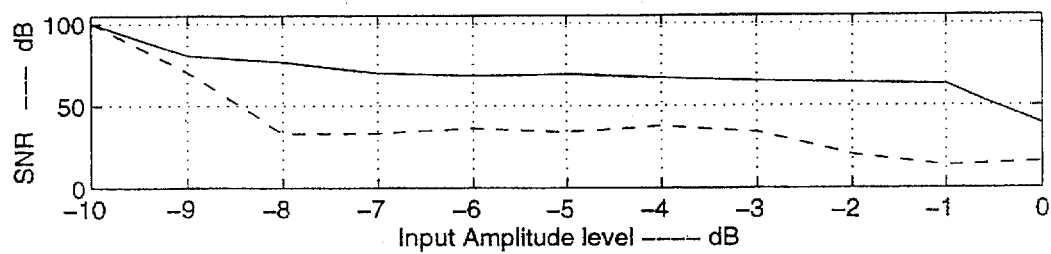
FIG. 7(B) is a microview of one part of the FIG. 7(a) plot.
Figure 7C:
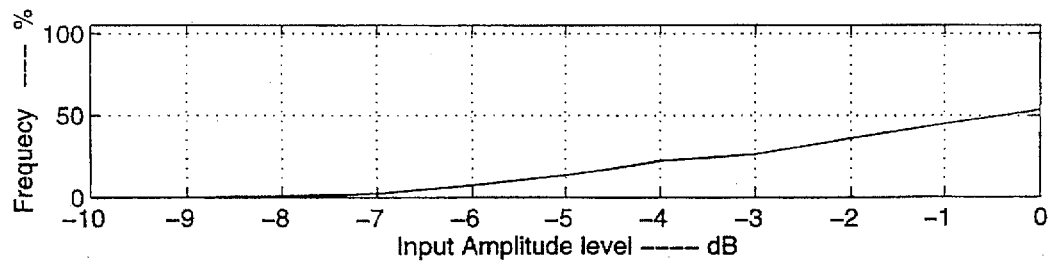
FIG. 7(C) is a plot which shows the ILF triggered frequency versus modulator input amplitude level.
Figure 8A:
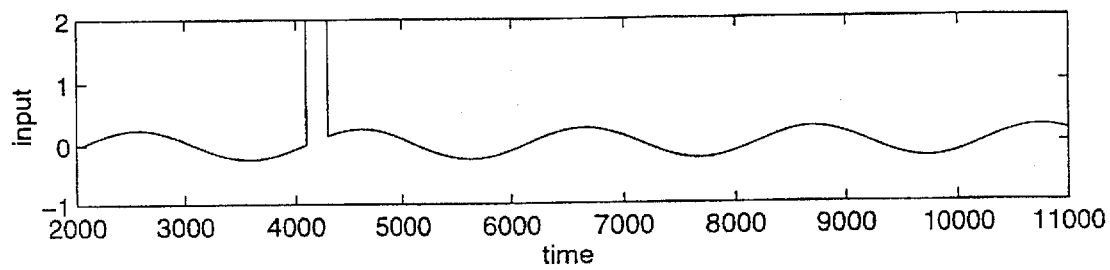
FIG. 8(a) is a plot which shows an input signal waveform to be used for a time-domain analysis.
Figure 8B:
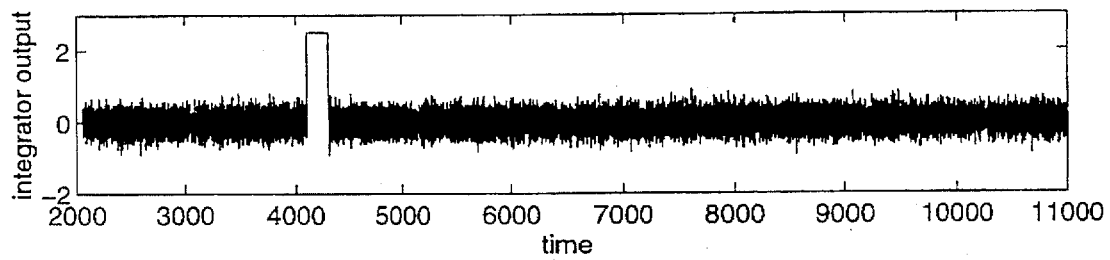
FIG. 8(b) is a time versus integrator output plot which shows a time-domain analysis of a FF-type sigma-delta modulator stabilized with the present ILF stabilizing mechanism.
Figure 8C:
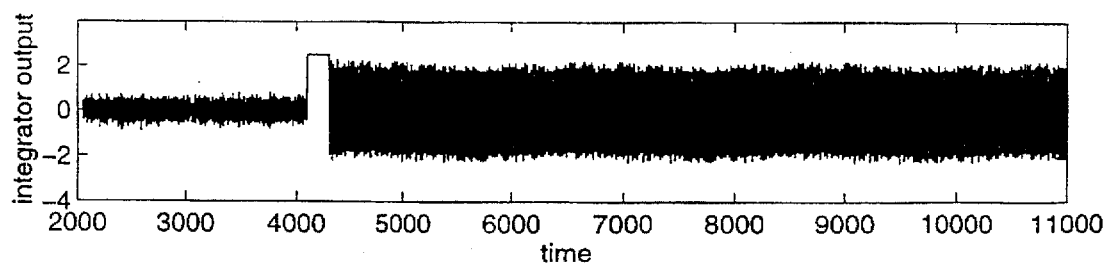
FIG. 8(c) is a time versus integrator output plot which shows a time-domain analysis of a FF-type sigma-delta modulator not stabilized with the present ILF stabilizing mechanism.

In the following, a fourth-order FF-type sigma-delta modulator in which the ILF stabilization according to the invention is applied is illustrated as an example for verifying our invention. The simulation condition is: oversampling ratio=64, baseband signal bandwidth=20 KHz, operating range of integrators=−2.5~2.5, $V_{max}$=1.4 and $V_{min}$=−1.4 while the DAC feedback reference is normalized to unity. For the frequency domain simulation as shown in FIGS. 7(a)–7(c), the invented ILF technique can effectively stabilize the modulator while the input level is large, consequently, the dynamic range (DR) is increased as shown. For the time domain simulation as shown in FIGS. 8(a)–(c), as a sinewave with an additive short-time pulse is applied to the input of the modulator a modulator with ILF technique will quickly be recovered to its normal mode operation while a modulator without ILF results in oscillation. This confirms that a modulator can be absolutely stabilized by adding the invented ILF technique.

A sigma-delta modulator can be utilized both for sigma-delta analog-to-digital converters (SDADCs) and for sigma-delta digital-to-analog converters (SDDACs), consequently the present invention could be applied to SDADCs as well as SDDACs. While the block diagram of FIG. 2 and FIG. 4 illustrate the realization of the stabilizing mechanisms according to our invention on the sigma-delta modulators of the MF-type and FF-type configurations utilized in SDADCs, the same idea can be extended to SDDACs with minor substitutions. Only the modifications relevant to the invention will be described below. The ADC means 22 is replaced by a digital quantizer and the DAC means 26 is removed. All connections originally attached to the output of said DAC means 26 are now attached to the output of said digital quantizer. In SDADCs, all the components in the modulator are realized in dealing with analog signals, on the other hand, in SDDACs the components are realized in dealing with digital signals.

Although the preferred embodiments have been described in detail, it should be understood that various modifications, changes, substitutions and alterations can be made therein without departing from the spirit and scope of the inventions as defined by the appended claims.

What is claimed is:

1. An internal linear feedback (ILF) mechanism for stabilizing a multiple-feedback type high-order sigma-delta modulator utilized in analog-to-digital converters, said high-order sigma-delta modulator comprising at least three cascaded integrator stages, an analog-to-digital converter (ADC) means to which the output of the last integrator stage is coupled, and a digital-to-analog converter (DAC) means to which the output of the ADC means is coupled, wherein an output of said DAC means is coupled to an input of each integrator stage and wherein at least the first integrator stage in the high-order sigma-delta modulator forms a low-order modulator said ILF mechanism comprising:

an overload detector, coupled to each of said cascaded integrator stages, said overload detector generating an overload signal when an output signal of at least one of said cascaded integrator stages exceeds a predetermined range corresponding to upper and lower limits of a stable operation range of said high-order sigma-delta modulator; and a selector circuit, coupled to and receiving said overload signal from said overload detector, that decouples the inputs of the integrator stages following the low-order modulator from the output of said DAC means and simultaneously couples the input of said ADC means to the inputs of the integrator stages following the low-order modulator when said overload detector generates said overload signal, said selector circuit recoupling the output of said DAC means to the inputs of the integrator stages following the low-order modulator and simultaneously decoupling the inputs of the integrator stages following the low-order modulator from the input of said ADC means when said output signal of said at least one of said cascaded integrator stages no longer exceeds said predetermined range.

2. The mechanism according to claim 1, wherein the high-order sigma-delta modulator is utilized in analog-to-digital converters.

3. The mechanism according to claim 2, wherein all components in said high-order sigma-delta modulator are realized in dealing with analog signals.

4. The mechanism according to claim 1, wherein the high-order sigma-delta modulator is realized in either discrete-time or continuous-time circuits.

5. The mechanism according to claim 1, wherein the high-order sigma-delta modulator is realized in dealing with either lowpass or bandpass input signal.

6. An internal linear feedback (ILF) mechanism for stabilizing a feedforward or follow-the-leader type high-order sigma-delta modulator utilized in analog-to-digital converters, said high-order sigma-delta modulator comprising at least three cascaded integrator stages, an analog-to-digital converter (ADC) means to which the output of the last integrator stage is coupled, and a digital-to-analog converter (DAC) means to which the output of the ADC means is coupled, wherein at least the first integrator stage in the high-order sigma-delta modulator forms a low-order modulator, said ILF mechanism comprising:

an overload detector, coupled to each of said cascaded integrator stages, said overload detector generating an overload signal when an output signal of at least one of said cascaded integrator stages exceeds a predetermined range corresponding to upper and lower limits of a stable operation range of said high-order sigma-delta modulator; and a selector circuit, coupled to and receiving said overload signal from said overload detector, that couples the input of said ADC means to an input of each of said integrator stages following said low-order modulator when said overload detector generates said overload signal, said selector circuit decoupling the inputs of each of said integrator stages following the low-order modulator from the input of said ADC means when said output signal of said at least one of said cascaded integrator stages no longer exceeds said predetermined range.

7. The mechanism according to claim 6, wherein the high-order sigma-delta modulators are utilized in analog-to-digital converters.

8. The mechanism according to claim 7, wherein all components in said high-order sigma-delta modulators are realized in dealing with analog signals.

9. The mechanism according to claim 6, wherein the high-order sigma-delta modulators are realized in either discrete-time or continuous-time circuits.

10. The mechanism according to claim 6, wherein the high-order sigma-delta modulators are realized in dealing with either lowpass or bandpass input signal.

11. An internal linear feedback (ILF) mechanism for stabilizing a multiple-feedback type high-order sigma-delta modulator utilized in digital-to-analog converters, said high-order sigma-delta modulator comprising at least three cascaded integrator stages and a digital quantizer means to which the output of the last integrator stage is coupled, wherein the output of said digital quantizer means is coupled to an input of each integrator stage and wherein at least the first integrator stage in the high-order sigma-delta modulator forms a low-order modulator said ILF mechanism comprising:

an overload detector, coupled to each of said cascaded integrator stages, said overload detector generating an overload signal when an output signal of at least one of said cascaded integrator stages exceeds a predetermined range corresponding to upper and lower limits of a stable operation range of said high-order sigma-delta modulator; and a selector circuit, coupled to and receiving said overload signal from said overload detector, that decouples the inputs of the integrator stages following the low-order modulator from the output of said digital quantizer means and simultaneously couples the input of said digital quantizer means to the inputs of the integrator stages following the low-order modulator when said overload detector generates said overload signal, said selector circuit recoupling the output of said digital quantizer means to the inputs of the integrator stages following the low-order modulator and simultaneously decoupling the inputs of the integrator stages following the low-order modulator from the input of said digital quantizer means when said output signal of said at least one of said cascaded integrator stages no longer exceeds said predetermined range.

12. The mechanism according to claim 11, wherein all components in said high-order sigma-delta modulator are realized in dealing with digital signals.

13. The mechanism according to claim 11, wherein the high-order sigma-delta modulator is realized in either discrete-time or continuous-time circuits.

14. The mechanism according to claim 11, wherein the high-order sigma-delta modulator is realized in dealing with either lowpass or bandpass input signal.

15. An internal linear feedback (ILF) mechanism for stabilizing a feedforward or follow-the-leader type high-order sigma-delta modulator utilized in digital-to-analog converters, said high-order sigma-delta modulator comprising at least three cascaded integrator stages and a digital quantizer means to which the output of the last integrator stage is coupled, wherein at least the first integrator stage in the high-order sigma-delta modulator forms a low-order modulator, said ILF mechanism comprising:

an overload detector, coupled to each of said cascaded integrator stages, said overload detector generating an overload signal when an output signal of at least one of said cascaded integrator stages exceeds a predetermined range corresponding to upper and lower limits of a stable operation range of said high-order sigma-delta modulator; and a selector circuit, coupled to and receiving said overload signal from said overload detector, that couples the input of said digital quantizer means to an input of each of said integrator stages following the low-order modulator when said overload detector generates said overload signal, said selector circuit decoupling the inputs of each of said integrator stages following the low-order modulator from the input of said digital quantizer means when said output signal of said at least one of said cascaded integrator stages no longer exceeds said predetermined range.

16. The mechanism according to claim 15, wherein all components in said high-order sigma-delta modulator are realized in dealing with digital signals.

17. The mechanism according to claim 15, wherein the high-order sigma-delta modulators are realized in either discrete-time or continuous-time circuits.

18. The mechanism according to claim 15, wherein the high-order sigma-delta modulators are realized in dealing with either lowpass or bandpass input signal.

* * * * *

UNITED STATES PATENT AND TRADEMARK OFFICE
CERTIFICATE OF CORRECTION

PATENT NO.   :   5,742,246
DATED        :   April 21, 1998
INVENTOR(S)  :   Kuo et al.

It is certified that error appears in the above-indentified patent and that said Letters Patent is hereby corrected as shown below:

Col. 1, Line 67 "staff" should be --start--; and

Col. 2, line 28 "staff" should be --start--.

Signed and Sealed this

Sixteenth Day of June, 1998

Attest:

BRUCE LEHMAN

Attesting Officer          Commissioner of Patents and Trademarks